United States Patent
Nongaillard et al.

(10) Patent No.: US 12,249,644 B2
(45) Date of Patent: Mar. 11, 2025

(54) ENHANCEMENT-MODE HIGH-ELECTRON-MOBILITY TRANSISTOR

(71) Applicant: STMicroelectronics International N.V., Geneva (CH)

(72) Inventors: Matthieu Nongaillard, Grenoble (FR); Thomas Oheix, Grenoble (FR)

(73) Assignee: STMICROELECTRONICS INTERNATIONAL N.V., Geneva (CH)

(*) Notice: Subject to any disclaimer, the term of this patent is extended or adjusted under 35 U.S.C. 154(b) by 873 days.

(21) Appl. No.: 17/058,117

(22) PCT Filed: May 7, 2019

(86) PCT No.: PCT/FR2019/051041
§ 371 (c)(1),
(2) Date: Nov. 23, 2020

(87) PCT Pub. No.: WO2019/224448
PCT Pub. Date: Nov. 28, 2019

(65) Prior Publication Data
US 2021/0202728 A1 Jul. 1, 2021

(30) Foreign Application Priority Data
May 22, 2018 (FR) ..................... 1854221

(51) Int. Cl.
*H01L 29/778* (2006.01)
*H01L 29/10* (2006.01)
*H01L 29/20* (2006.01)

(52) U.S. Cl.
CPC ...... *H01L 29/7786* (2013.01); *H01L 29/1066* (2013.01); *H01L 29/2003* (2013.01)

(58) Field of Classification Search
CPC ............. H01L 29/7786; H01L 29/1066; H01L 29/2003; H01L 29/66462; H01L 29/0649; H01L 29/0623
(Continued)

(56) References Cited

U.S. PATENT DOCUMENTS 5,187,379 A * 2/1993 Noda ................ H01L 29/66878
257/280
2006/0273347 A1 12/2006 Hikita et al.
(Continued)

FOREIGN PATENT DOCUMENTS

FR 3047609 A1 8/2017

OTHER PUBLICATIONS

International Search Report for International Application No. PCT/FR019/051041 dated Sep. 12, 2019, 2 pages.
(Continued)

*Primary Examiner* — Nduka E Ojeh
*Assistant Examiner* — Laura M Dykes
(74) *Attorney, Agent, or Firm* — Seed IP Law Group LLP (57) ABSTRACT

An enhancement-mode high-electron-mobility transistor comprises a structure including a stack made of III-V semiconductor materials defining an interface and capable of forming a conduction layer in the form of a two-dimensional electron gas layer; a source electrode and a drain electrode forming an electrical contact with the conduction layer; and a gate electrode arranged on top of the structure, between the source electrode and the drain electrode. The structure comprises a bar that is arranged below the gate electrode and passes through the interface of the stack. The bar comprises two semiconductor portions exhibiting opposite types of doping, defining a p-n junction in proximity to the interface.

20 Claims, 8 Drawing Sheets

(58) Field of Classification Search
USPC .......................................................... 257/183
See application file for complete search history.

(56) References Cited

U.S. PATENT DOCUMENTS

| | | | | |
|---|---|---|---|---|
| 2009/0267078 | A1* | 10/2009 | Mishra | .................. H01L 29/365 |
| | | | | 257/E21.403 |
| 2010/0102357 | A1* | 4/2010 | Sato | .................. H01L 29/42316 |
| | | | | 257/192 |
| 2011/0108885 | A1* | 5/2011 | Sazawa | ............... H01L 29/1054 |
| | | | | 257/E21.119 |
| 2014/0077267 | A1* | 3/2014 | Heo | .................. H01L 29/66431 |
| | | | | 257/194 |
| 2014/0091316 | A1* | 4/2014 | Kikkawa | ........... H01L 29/66431 |
| | | | | 438/172 |
| 2015/0028345 | A1* | 1/2015 | Wong | .................. H01L 29/2003 |
| | | | | 438/172 |
| 2018/0323297 | A1* | 11/2018 | Suh | ...................... H01L 29/7786 |
| 2020/0119178 | A1* | 4/2020 | Okita | .................... H01L 29/452 |

OTHER PUBLICATIONS

International Written Opinion for International Application No. PCT/FR019/051041 dated Sep. 12, 2019, 7 pages.
Kaneko et al., Current-Collapse-Free Operations up to 850 V by GaN-GIT Utilizing Hole Injection from Drain, Proceedings of the 27th International Symposium on Power Semiconductor Devices & IC's May 10-14, 2015, pp. 41-44.
Marcon et al., Direct Comparison of GaN-Based-E-Mode Architectures (Recessed MISHEMT and p-GaN HEMTs) Processed on 200mm GaN-on-Si with Au-Free Technology, Proceedings of SPIE—The International Society for Optical Engineering, Mar. 2015, 13 pages.
Saito et al., Recessed-Gate Structure Approach Toward Normally off High-Voltage AlGaN/GaN HEMT for Power Electronics Applications, IEEE Transactions on Electron Devices, vol. 53, No. 2, Feb. 2006, pp. 356-362.

* cited by examiner

ENHANCEMENT-MODE HIGH-ELECTRON-MOBILITY TRANSISTOR

CROSS-REFERENCE TO RELATED APPLICATIONS

This application is a national phase entry under 35 U.S.C. § 371 of International Patent Application PCT/FR2019/051041, filed May 7, 2019, designating the United States of America and published as International Patent Publication WO 2019/224448 A1 on Nov. 28, 2019, which claims the benefit under Article 8 of the Patent Cooperation Treaty to French Patent Application Serial No. 1854221, filed May 22, 2018.

TECHNICAL FIELD

The present disclosure relates to the field of heterojunction transistors based on III-V materials. It relates, in particular, to a transistor with high-electron-mobility of the normally off type.

BACKGROUND

HEMT transistors (high-electron-mobility transistors) produced on III-N semiconductor materials are conventionally of the "normally on" type, that is to say, they can conduct current with a gate voltage at 0 V. These components are also called depletion-mode ("D-mode") components. In order to prevent a gate failure from switching the component to on mode, it is preferable for power electronics applications to have devices of the normally off type, that is to say, which cannot conduct current when the gate voltage is at 0 V; these components are commonly referred to as enhancement-mode ("E-mode") components.

A first known approach for the manufacture of E-mode components is the use of a recessed gate electrode in the III-N layers. Typically, in the case of a HEMT based on an AlGaN/GaN stack, the recess trench in which the gate metal will be deposited crosses the AlGaN/GaN interface and, in particular, the two-dimensional electron gas (2DEG) layer formed just below the interface. An enhancement-mode component is thus obtained, the electrical conduction between the source and the drain being cut when the grid voltage is at 0 V. The application of a voltage on the gate makes it possible to attract electrons in the lower GaN layer, near the border with the gate, and to re-establish the continuity of electrical conduction of the 2DEG layer.

An example of a recessed gate structure is described by W. Saito et al. ("Recessed-gate structure approach toward normally off high-Voltage AlGaN/GaN HEMT for power electronics applications," IEEE Transactions on Electron Devices, Volume 53, Feb. 2, 2006), or by D. Marcon et al. in the document "Direct comparison of GaN-based e-mode architectures (recessed MISHEMT and p-GaN HEMTs) processed on 200 mm GaN-on-Si with Au-free technology," Gallium Nitride Materials and Devices X, Proc. of SPIE Vol. 9363, 2015.

This first approach makes it possible to obtain low gate leakage currents and implements conventional integration methods. However, it has the drawback of increasing the resistance of the component because the conduction in the GaN layer is much less efficient than in the 2DEG layer.

A second known approach for manufacturing E-mode components is the implementation of a gate electrode with a region exhibiting P-type doping. A trench is etched in the AlGaN layer to leave only a small thickness of the layer above the AlGaN/GaN interface. A layer of P-doping semiconductor material (for example, P-doped GaN) is deposited in the trench.

The P-type material near the 2DEG layer will create a space charge region, depleting the 2DEG layer under the gate and thus cutting the conduction between the source and the drain: the component is in enhancement mode. Applying a positive voltage to the gate makes it possible to repopulate the 2DEG layer with free carriers and thus to re-establish the continuity of electrical conduction of the 2DEG layer.

A specific example of a structure having a gate with p-GaN region is described in the document "Current-collapse-free Operation up to 850 V by GaN-GIT utilizing Hole Injection from Drain," S. Kaneko et al., Proceedings of the 27th ISPSD 2015.

The resistance of the component, with this second approach, can be kept at acceptable values. On the other hand, the integration processes are complex and the gate leakage is greater.

BRIEF SUMMARY

The present disclosure addresses all or part of the aforementioned drawbacks by proposing an alternative solution to the approaches of the state of the art. An object of the present disclosure is to provide an enhancement-mode high-electron-mobility transistor.

In particular, the present disclosure relates to an enhancement-mode high-electron-mobility transistor comprising:
- a structure comprising a stack of III-V-type semiconductor materials defining an interface and capable of forming a conduction layer in the form of a two-dimensional electron gas layer, substantially below the interface,
- a source electrode and a drain electrode, each in electrical contact with the conduction layer, and
- a gate electrode positioned on the structure, between the source electrode and the drain electrode.

The structure comprises a bar positioned under the gate electrode and crossing the interface of the stack. The bar comprises two semiconductor portions formed from materials of the same nature and of the opposite doping type, respectively, P- and N-doped, defining a PN junction positioned in the plane of the interface or in a parallel plane, substantially above or below the plane of the interface.

According to advantageous features of the enhancement-mode high-electron-mobility transistor according to the present disclosure, taken alone or in combination:
- the parallel plane, substantially above or below the plane of the interface, in which the PN junction is positioned, is located at +/−5 nm from the plane of the interface;
- the bar comprises a first semiconductor portion that is essentially located below the interface, and a second semiconductor portion that is essentially located above the interface, the one of the two semiconductor portions that is made from N-doped material being located on either side of the interface;
- at least one semiconductor portion comprises two layers of materials of the same doping type but of different doping levels, the least-doped layer of the at least one semiconductor portion forming the PN junction with the other semiconductor portion;
- all or part of the bar is electrically insulated from a channel layer of the stack by a dielectric layer, the dielectric layer being thin enough not to block the current at the conduction layer when the transistor is in an on state, at least in cases where the dielectric layer is present between the conduction layer and the bar;

the P- or N-doped materials of the bar exhibit doping levels between $1^E15/cm^3$ and $1^E21/cm^3$;

the P-type material of the bar is gallium nitride doped with magnesium or carbon;

the N-type material of the bar is gallium nitride doped with silicon or germanium;

the bar has a width of between 0.25 and 5 microns and a length, the width and the length being parallel to the plane of the interface, the width extending along a transverse axis connecting the source electrode to the drain electrode and the length extending along a longitudinal axis orthogonal to the transverse axis;

the stack is formed of III-N type semiconductor materials, in particular, of AlGaN and GaN;

the gate electrode is insulated from the stack of semiconductor materials by an insulating layer to form a gate with an MIS (metal-insulator-semiconductor) configuration.

BRIEF DESCRIPTION OF THE DRAWINGS

Further features and advantages of the disclosure will become apparent from the following detailed description of example embodiments, with reference to the accompanying drawings, in which.

DETAILED DESCRIPTION

The figures are schematic representations of devices in cross-sectional or in perspective view, in which the lateral or vertical proportions and dimensions may not be respected. The same reference signs in the drawings can be used for elements of the same type.

The disclosure relates to an enhancement-mode high-electron-mobility transistor (HEMT) 100.

Figure 1A:
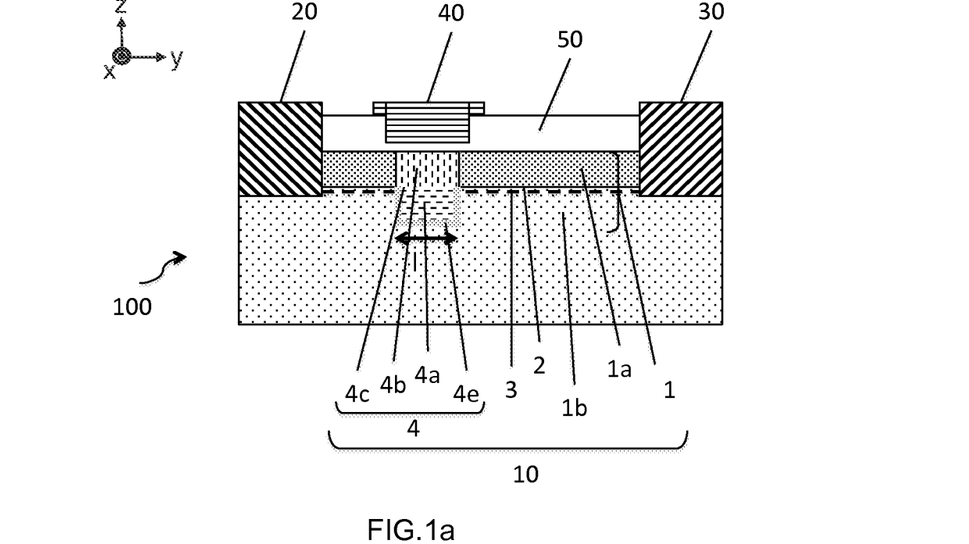
FIGS. 1a, 1b and 1c show cross-sectional and perspective views of a transistor according to the disclosure.
Figure 1B:
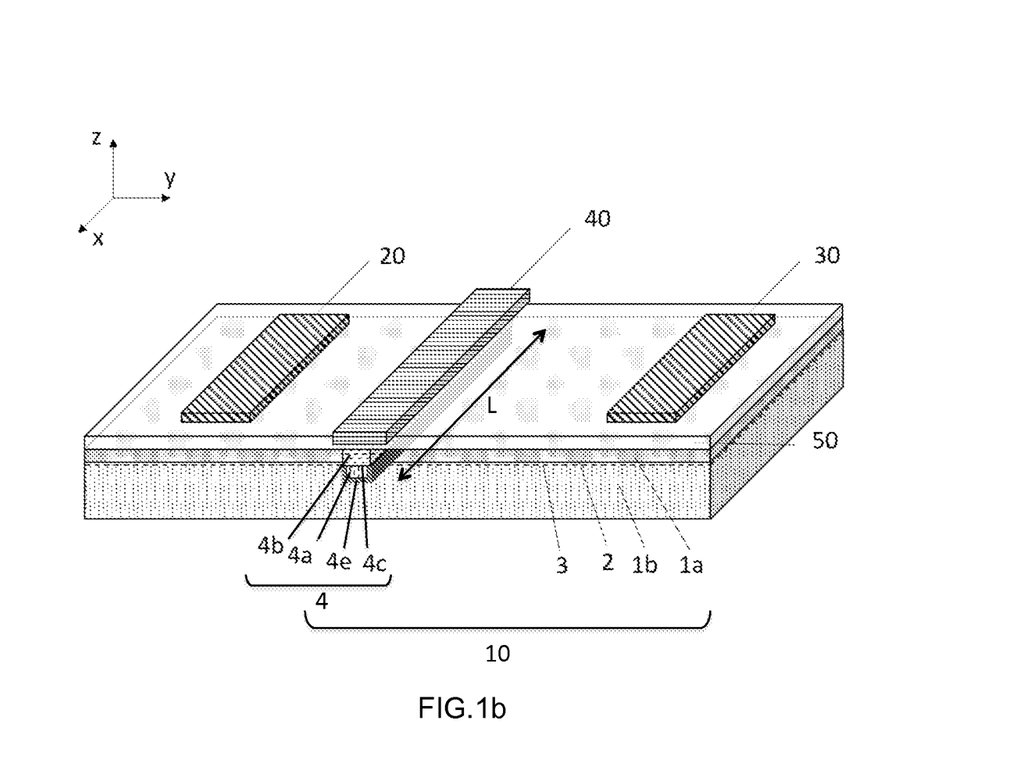
Figure 1C:
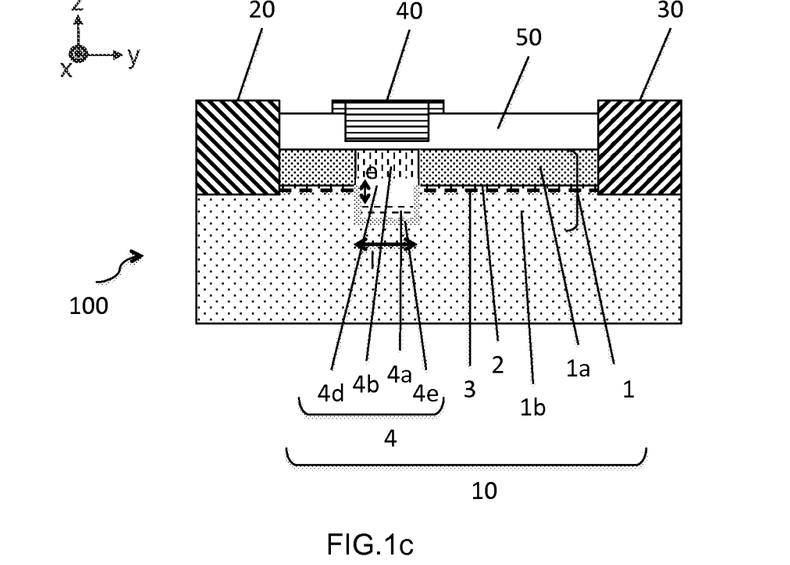

As illustrated in FIGS. 1a, 1b and 1c, the transistor 100 is formed from a structure 10 comprising a stack 1 of group III-V semiconductor materials and, in particular, of group III-N semiconductor materials. The stack 1 comprises at least one barrier layer 1a positioned on a channel layer 1b, and defines an interface 2 between these two layers. The layers 1a, 1b and the interface 2 extend in planes parallel to a main plane (x, y).

The group III-V semiconductor materials may, in particular, be chosen from gallium nitride (GaN), aluminum nitride (AlN) and their ternary alloys $Al_xGa_{1-x}N$, or from gallium arsenide (GaAs) and its compounds (AlGaAs, InGaAs). By way of example, a barrier layer 1a could be produced based on AlGaN and the channel layer 1b based on GaN.

Such a stack 1 is capable of forming a two-dimensional electron gas (2DEG) layer located just below the interface 2 between the barrier layer 1a and the channel layer 1b. The 2DEG layer constitutes the conduction layer 3 of the transistor 100.

The transistor 100 comprises a source electrode 20 and a drain electrode 30 that are in electrical contact with the conduction layer 3. It should be remembered that different types of electrical contacts are known for electrically connecting the source 20 and drain 30 electrodes to the conduction layer 3: in particular ohmic, tunnel or Schottky contacts.

The conduction layer 3 ensures the conduction of the current between these two electrodes 20, 30 when the transistor 100 is in an on state.

The transistor 100 also comprises a gate electrode 40, positioned on the structure 10 between the source 20 and drain 30 electrodes. The gate electrode 40 is positioned along a longitudinal axis x over the entire extent (dimension along the x axis) of the conduction layer 3, so as to control the conduction of the current between the source electrode 20 and the drain electrode 30 (FIG. 1b).

In the example of FIGS. 1a to 1c, the gate electrode 40 is insulated from the stack 1 by an insulating layer 50 or a stack of insulating layers, to form an MIS (Metal-Insulator-Semiconductor) gate configuration. Of course, other configurations of gate electrodes exist and could possibly be implemented to manufacture the transistor 100.

The structure 10 of the transistor 100 according to the disclosure further comprises a bar 4 positioned below the gate electrode 40 (FIGS. 1a and 1b). The bar 4 has a width 1 and a length L in a plane parallel to the main plane (x, y) of the interface 2 (and, therefore, of the conduction layer 3): the length L is the dimension of the bar 4 extending along the longitudinal axis x and the width 1 is the dimension extending along the transverse axis y, orthogonal to the longitudinal axis x.

The length L of the bar 4 (along the longitudinal axis x) coincides with the extent of the gate electrode 40 along the longitudinal axis x, which corresponds to the extent of the conduction layer 3. The width of the bar 4 (along the transverse axis y) may be of the same order of magnitude as the dimension of the gate electrode 40 along the transverse axis y, the axis connecting the source electrode 20 and the drain electrode 30.

By way of example, the width 1 of a bar 4 may be between 0.25 µm and 5 µm; its length L will depend on the size of the transistor (current or resistance constraints in the on state).

In addition, the bar 4 at least partially crosses stack 1, orthogonally to the main plane (x, y). It, in particular, crosses the interface 2 of the stack 1, thus interrupting the conduction layer 3 over its entire extent along the longitudinal axis x.

The bar 4 comprises two semiconductor portions 4a, 4b formed by materials of the same nature and of the opposite doping type, defining a PN junction 4c near the interface 2 and positioned in the plane of the interface 2 or in a parallel plane substantially above or below the plane of the interface 2 (FIG. 1a). In other words, the bar 4 comprises a first semiconductor portion 4a made of semiconductor material, essentially situated below the interface 2, and a second semiconductor portion 4b made of semiconductor material, essentially situated above the interface 2: one of the semiconductor portions has a P-type doping and the other has an N-type doping so as to create a PN junction 4c extending in a plane substantially parallel and close to the plane of the interface 2. The PN junction 4c in the context of this disclosure is a homojunction, that is to say, it is formed from two portions whose constituent materials are of the same nature. For example, two silicon portions, one of the P-type and the other of the N-type, or two GaN portions, also of opposite doping, could be envisaged. Such a PN homojunction 4c has the advantage of being simple to manufacture.

The parallel plane, substantially above or below the plane of the interface 2, in which the PN junction 4c is positioned, is located at +/−8 nm from the plane of the interface 2, or even advantageously at +/−5 nm from the plane of the interface 2.

By "P-type material" is meant a material comprising an excess of positive charge carriers (holes). By "N-type material" is meant a material comprising an excess of negative charge carriers (electrons).

A space charge region 4d will extend, from the PN junction 4c, into each of the semiconductor portions 4a, 4b over a certain thickness e in the bar 4 (FIG. 1c). Indeed, the excess of negative charge carriers of the N-type semiconductor portion will be compensated by the excess of positive charge carriers of the P-type semiconductor portion, in a certain thickness on either side of the PN junction; this compensation will be done in the extension e of the space charge region 4d. The space charge region 4d makes it possible to cut the conduction layer 3, when the potential of the gate electrode 40 is at 0 V, thus placing the transistor 100 in the off state. In fact, the transistor 100 is found to be of the normally off type or in enhancement mode because the conduction between the source electrode 20 and the drain electrode 30 is cut when the potential of the gate is at 0 V.

The polarization of the gate electrode 40 will modify the extension e of the space charge region 4d; at a given bias voltage of the gate electrode 40, the space charge region 4d will disappear and the presence of charge carriers in the bar 4, in the plane of the conduction layer 3, will make it possible to re-establish the conduction through the bar 4 along the transverse axis y, and thus between the source electrode 20 and the drain electrode 30. The conduction under the gate electrode 40 is established in a semiconductor portion of the bar 4 and not via a 2DEG layer. The transistor 100 then switches to the on state. The resistivity of the area under the gate electrode 40, in the on mode, is mainly linked to the doping levels of the semiconductor portions 4a, 4b of the bar 4.

The extension e of the space charge region 4d will depend on the doping levels of the two semiconductor portions 4a, 4b of the bar 4. Note that the greater the extension e of the space charge region 4d is, the greater the bias voltage of the gate electrode 40 necessary to cancel the space charge region 4d will be.

A gate electrode 40 having an MIS configuration is particularly advantageous in that it makes the transistor 100 more resistant to unwanted currents liable to be increased by the electric field developing at the PN junction 4c of the bar 4.

To limit any current leaks, the bar 4 preferably comprises a dielectric layer 4e that insulates it, in whole or in part, from the channel layer 1b of the stack 1. This dielectric layer 4e must be thin enough not to block the current at the conduction layer 3, when the transistor 100 is in the on state, but only to prevent an unwanted drain/source conduction through the bar 4, in the embodiments for which the dielectric layer 4e is present between the 2DEG layer and the bar 4.

Figure 2A:
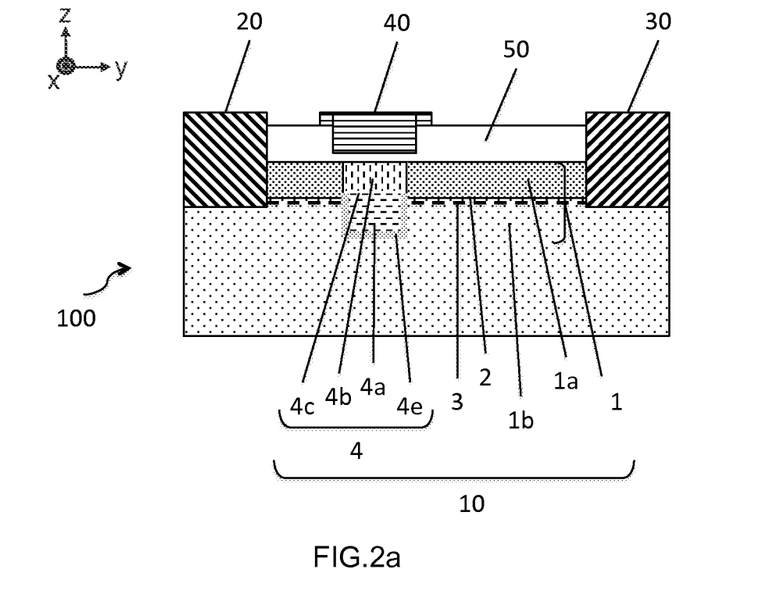
FIGS. 2a and 2b show a transistor according to a first embodiment of the disclosure.

According to a first embodiment, illustrated in FIGS. 2a and 2b, the first semiconductor portion 4a of the bar 4 is essentially located below the interface 2 and is formed from at least one N-doped material. The first semiconductor portion 4a must at least be opposite the conduction layer 3 so that the conduction can be established there in the on state. It may include a part extending substantially above the interface 2, positioning the PN junction 4c substantially above the interface 2, as illustrated in FIG. 2a. As mentioned above, to limit current leaks, the bar 4 comprises a dielectric layer 4e that insulates the first semiconductor portion 4a of the channel layer 1b of the stack 1. The dielectric layer 4e is thin enough not to block the current at the conduction layer 3. By "sufficiently thin," is meant a thickness less than 10 nm, or even less than 5 nm depending on the dielectric used (AlN, Al$_2$O$_3$, SiN, SiO$_2$, etc.).

By way of example, the material of the first semiconductor portion 4a will be GaN doped with a donor element (N-type) such as silicon or germanium. According to other examples, the N-type material of the first semiconductor portion 4a may be silicon doped with phosphorus, germanium doped with phosphorus, or any other material comprising an excess of negative charge carriers.

The second semiconductor portion 4b of the bar 4, positioned on the first semiconductor portion 4a, is located above the interface 2. It is formed from at least one P-doped material.

By way of example, the material will be GaN doped with an acceptor element (P-type) such as magnesium or carbon. According to other examples, the P-type material of the second semiconductor portion 4b may be silicon doped with boron, germanium doped with boron, or any other material comprising an excess of positive charge carriers. It should be remembered that the materials forming the first semiconductor portion 4a and the second semiconductor portion 4b are of the same nature.

Advantageously, the P-type material is heavily doped (i.e., P+ doped). Reference will be made to a P+ doped material in the case of a dopant concentration in the semiconductor material greater than $1^E18$/cm$^3$. The P+ doping level is preferably between $1^E19$ to $1^E21$/cm$^3$.

Advantageously, the N-type material is lightly doped (i.e., N− doped). Reference will be made to an N− doped material in the case of a dopant concentration in the semiconductor material less than or equal to $1^E16$/cm$^3$. The difference in doping levels of the P and N materials ensures that the greatest space charge expansion will occur in the N-type material and thus effectively disrupt the conduction layer 3.

Figure 2B:
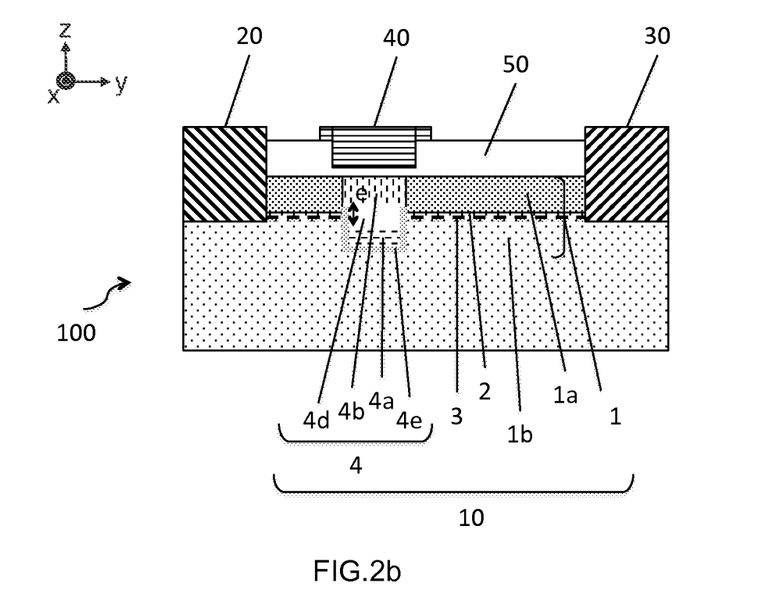

In all cases, the positioning of the PN junction 4c with respect to the plane of the interface 2 of the stack 1, as well as the doping level of the first semiconductor portion 4a and second semiconductor portion 4b will be chosen so that the space charge region 4d has an extension e sufficient to cut the conduction path, in the plane of the conduction layer 3 (substantially below the interface 2) of the stack 1 (FIG. 2b).

The threshold voltage of the transistor 100 is the voltage to be applied to gate electrode 40 in order to switch the transistor 100 to the on state. In this first embodiment, a positive voltage applied to the gate electrode 40 will, by electrostatic effect, repopulate the space charge region that extends in the first N-type semiconductor portion 4a. The current conduction along the transverse axis y is then re-established, the transistor 100 is in the on state.

Figure 3A:
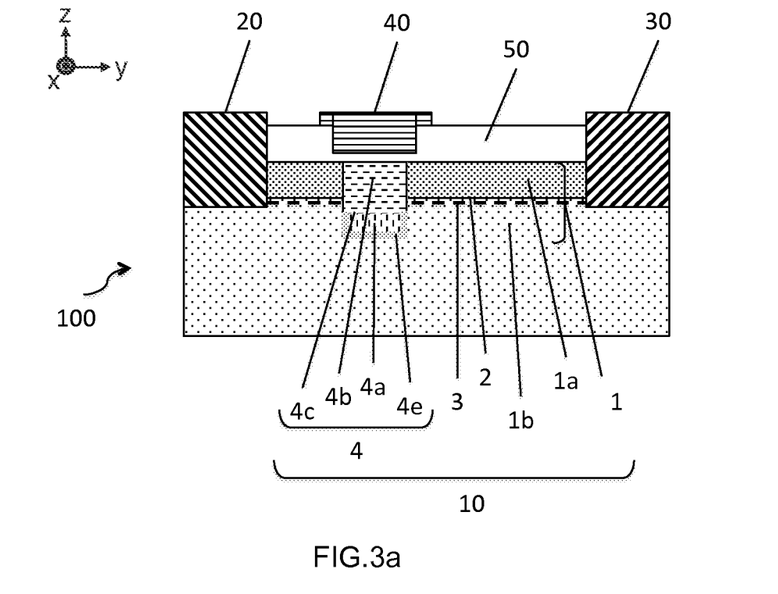
FIGS. 3a and 3b show a transistor according to a second embodiment of the disclosure.

According to a second embodiment, illustrated in FIGS. 3a and 3b, the first semiconductor portion 4a of the bar 4 is located below the interface 2, and is formed from at least one P-doped material.

By way of example, the material will be GaN doped with an acceptor element (P-type) such as magnesium or carbon. According to other examples, the P-type material of the bar 4 may be silicon doped with boron, germanium doped with boron, or any other material comprising an excess of positive charge carriers.

The second semiconductor portion 4b of the bar 4 is formed from at least one N-doped material. The second semiconductor portion 4b is essentially located above the interface 2. The second semiconductor portion 4b must also be opposite the conduction layer 3 so that the conduction can be established there in the on state. For this, it comprises a part extending substantially below the interface 2, thus positioning the PN junction 4c substantially below the interface 2, as illustrated in FIG. 3a.

By way of example, the material of the second semiconductor portion 4b will be GaN doped with a donor element (N type) such as silicon or germanium. According to other examples, the N-type material of the bar may be silicon doped with phosphorus, germanium doped with phosphorus, or any other material comprising an excess of negative charge carriers. It should be remembered that the first semiconductor portion 4a and the second semiconductor portion 4b are formed from a material of the same nature, with opposite doping.

As mentioned above, to limit current leaks, the bar 4 also comprises a dielectric layer 4e that insulates the first semiconductor portion 4a of the channel layer 1b of the stack 1.

Advantageously, the P-type material is heavily doped (i.e., P+ doped). Reference will be made to a P+ doped material in the case of a dopant concentration in the semiconductor material greater than $1^E18/cm^3$. The P+ doping level is preferably between $1^E19$ to $1^E21/cm^3$. The N-type material is lightly doped (i.e., N– doped). Reference will be made to an N– doped material in the case of a dopant concentration in the semiconductor material less than or equal to $1^E16/cm^3$. The difference in doping levels of the P and N materials ensures that the greatest space charge expansion will occur in the N-type material and, thus, effectively disrupt the conduction layer 3.

Figure 3B:
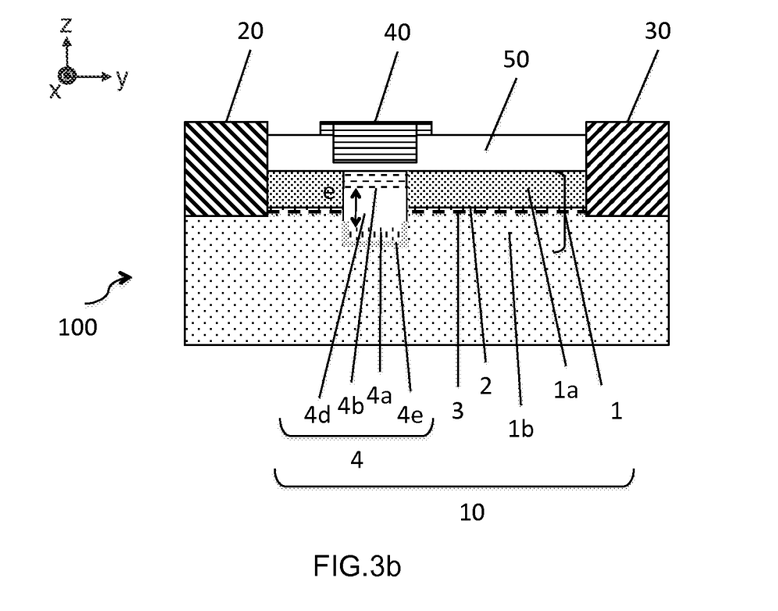

In all cases, the positioning of the PN junction 4c vis-à-vis the plane of the interface 2 of the stack 1 as well as the doping level of the first semiconductor portion 4a and second semiconductor portion 4b will be chosen so that the space charge region 4d has an extension e sufficient to intersect the conduction path, in the plane of the conduction layer 3 (substantially below the interface 2) of the stack 1 (FIG. 3b).

In this second embodiment, a negative voltage applied to the gate electrode 40 will make it possible to repopulate the space charge region and thus allow the conduction of current along the transverse axis y, the transistor 100 is in the on state.

In the first and second embodiments, a mode of conduction in the N-type semiconductor portions is described. According to variants of these embodiments, it is possible to produce transistors 100 in which conduction is established in the P-type semiconductor portions:
  by adapting the doping levels (P+ becomes P– and N– becomes N+),
  by modifying the position of the PN junction 4c with respect to the interface 2, the P-type material being required is opposite the conduction layer 3 so that the conduction can be established in the P-type material in the on state.

According to a third embodiment, illustrated in FIGS. 4a and 4b, the first semiconductor portion 4a of the bar 4 is essentially located below the interface 2, and it is formed from at least one N-doped material. The examples of N-doped materials set forth in the first and second embodiments also apply here.

The first semiconductor portion 4a comprises two layers 4a', 4a" of materials with the same doping type (N in the present case), but with different doping levels. Typically, the lower layer 4a' (hereinafter called the first lower layer 4a' because it relates to the first semiconductor portion 4a) is heavily doped (N+), and the upper layer 4a" (hereinafter called the first upper layer 4a" because it relates to the first portion 4a) is lightly doped (N–). As mentioned above, to limit any current leaks, the first semiconductor portion 4a is further insulated from the channel layer 1b of the stack 1 by a dielectric layer 4e. The dielectric layer 4e is thin enough not to block the current at the conduction layer 3.

The second semiconductor portion 4b of the bar 4 is located above the interface 2 and it is formed from at least one doped material P. The examples of P-doped materials set forth in the first and second embodiments also apply here.

The second semiconductor portion 4b also comprises two layers 4b', 4b" of material with the same doping type (P in the present case), but with different doping levels. Typically, the lower layer 4b' (hereinafter called the second lower layer 4b') is lightly doped (P–), and the upper layer 4b" (hereinafter called the second upper layer 4b") is heavily doped (P+).

As before, the first semiconductor portion 4a and the second semiconductor portion 4b are formed from materials of the same nature.

Figure 4A:
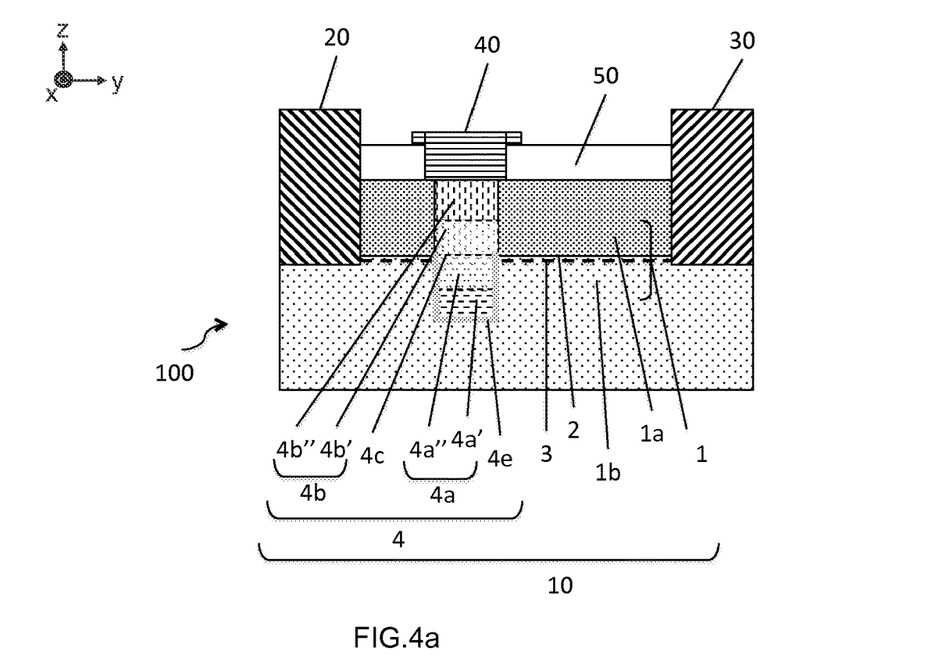
FIGS. 4a and 4b show a transistor according to a third embodiment of the disclosure.
Figure 4B:
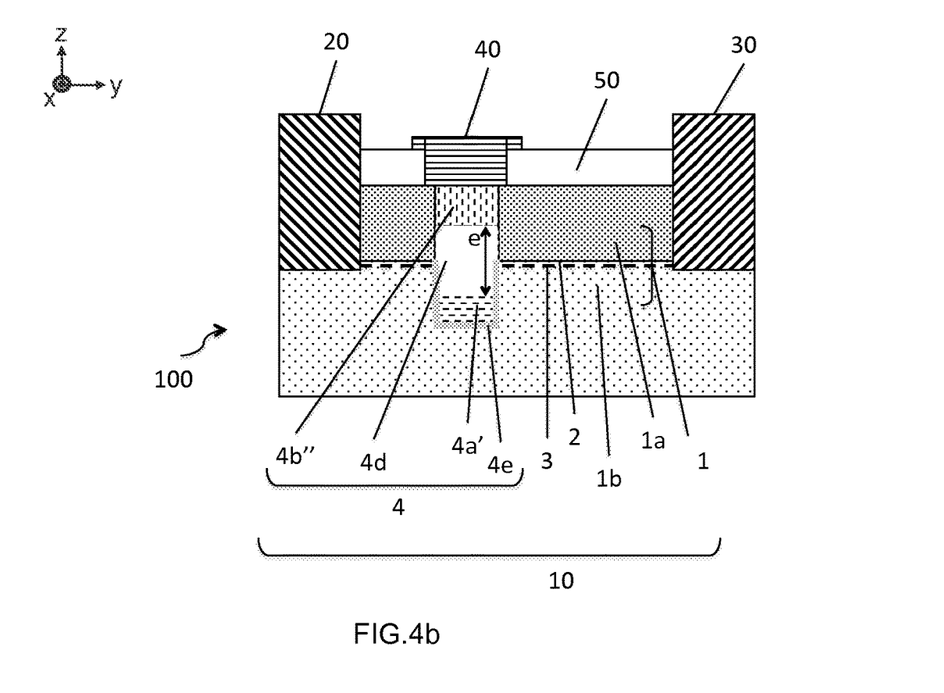

The positioning of the PN junction 4c with respect to the plane of the interface 2 of the stack 1 as well as the doping level of the first upper layer 4a" and of the second lower layer 4b' are chosen so that the space charge region 4d has a sufficient extension to cut the conduction path, in the plane of the conduction layer 3 (substantially below the interface 2) of the stack 1 (FIG. 4b). In this third embodiment, the extension of the space charge region takes place in the N– and P– materials.

The first N+ doped lower layer 4a' and the second P+ doped upper layer 4b" can be biased independently to act on the extension e of the space charge region 4d. The transconductance of the transistor 100 can be adjusted as a function of the control voltage levels. The application of a positive voltage on the second upper layer 4b" (P+) and of a negative voltage on the first lower layer 4a' (N+) will restore the current conduction along the transverse axis y: the transistor 100 is then in the on state.

Advantageously, the polarization of the gate electrode 40 is directly applied to the second upper layer 4b" (P+ doped), as illustrated in FIGS. 4a, 4b; an independent bias voltage is applied to the first lower layer 4a' (N+ doped).

Alternatively, a gate electrode 40 of the MIS type (metal-insulator-semiconductor), insulated from the bar 4, as illustrated in the first and second embodiments, could be implemented in the third embodiment.

According to a variant of this third embodiment, the first semiconductor portion 4a does not include the two layers 4a', 4a" of materials with different doping levels, but is similar to the first semiconductor portion 4a described in the first embodiment.

According to another variant, the second semiconductor portion 4b does not include the two layers 4b', 4b" of materials with different doping levels, but only comprises a P-doped material.

According to yet another variant of the third embodiment, the types of doping can be reversed (N+ becomes P+ and N– becomes P–, and vice versa), for a conduction mode in a P-type semiconductor portion.

Example Embodiment

The stack 1 of layers of the structure 10 is usually manufactured by epitaxial growth on a support substrate such as silicon, sapphire, silicon carbide or other compatible support, for example. Advantageously, a buffer layer is interposed between the support substrate and the channel layer 1b, in order to limit mesh misalignments between them.

By way of example, consider a barrier layer 1a based on $Al_{0.2}Ga_{0.8}N$ of the order of 20 nm in thickness, and a channel layer 1b, based on GaN. An insulating protective layer 51, preferably $Si_3N_4$ or $SiO_2$, will be deposited on the surface of the barrier layer 1a.

Figure 5A:
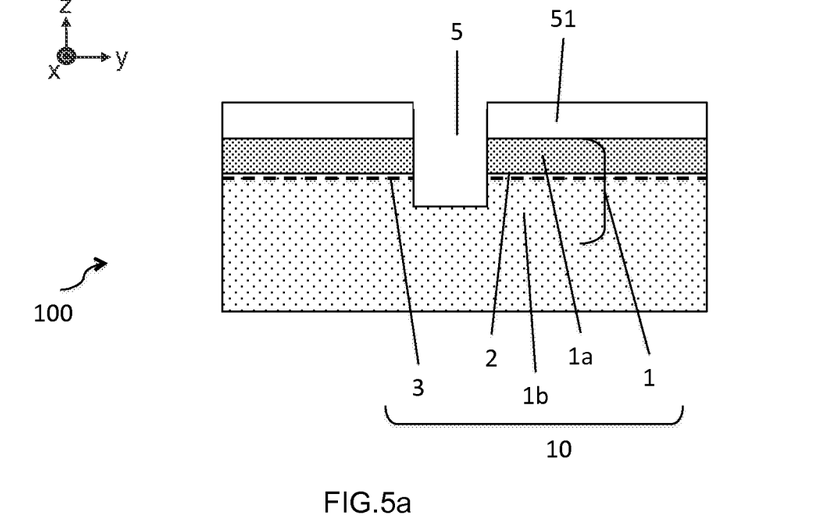
FIGS. 5a to 5e show steps in the manufacture of a transistor according to the disclosure.
Figure 5B:
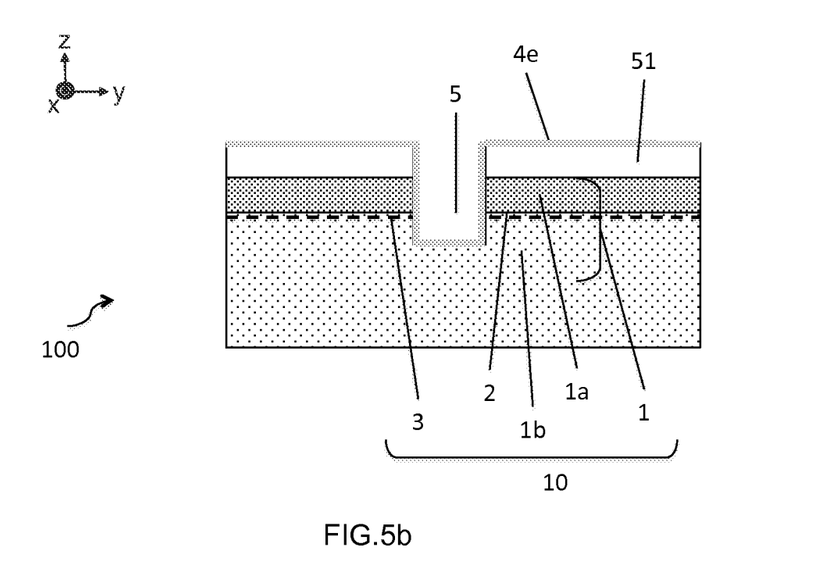

The bar 4 is produced prior to the formation of the electrodes 20, 30, 40 by successive stages of etching and deposition. A local etching of the zone of the stack 1 intended to accommodate the bar 4 is carried out, for example, to a depth of 60 nm, in order to form a trench 5 crossing the interface 2 (FIG. 5a). A layer with insulating properties (for example, silicon oxide, aluminum nitride or alumina, etc.), called dielectric layer 4e, intended to insulate the first semiconductor portion 4a of the channel layer 1b is deposited in the trench 5, on its walls and on the stack 1 (FIG. 5b). This dielectric layer 4e could, for example, have a thickness of a few nanometers, typically 5 nm.

Figure 5C:
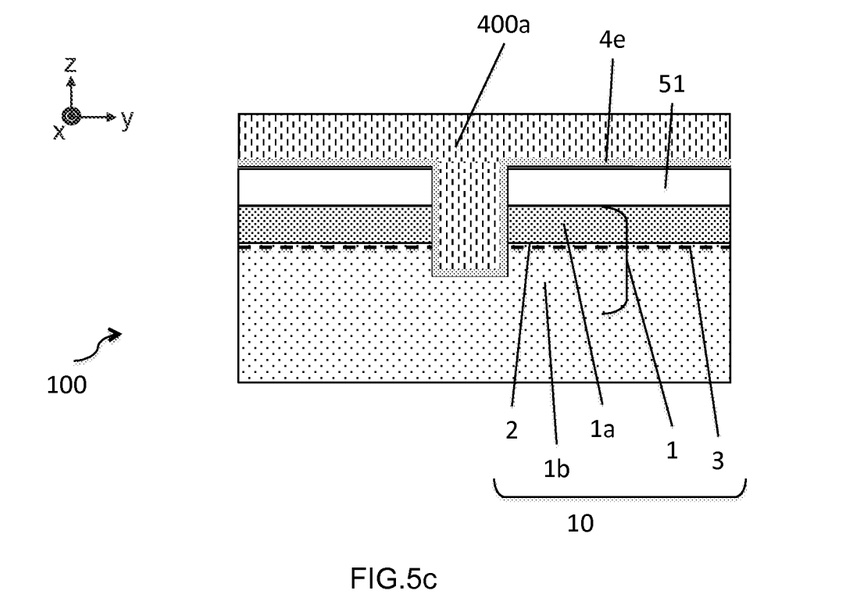

A layer 400a of material intended to form the first semiconductor portion 4a of the bar 4 (for example, P+ doped GaN according to the second embodiment) is deposited on the dielectric layer 4e (FIG. 5c). Advantageously, a conformal deposition technique is implemented, to avoid creating cavities ("voids") when filling the trench 5.

Figure 5D:
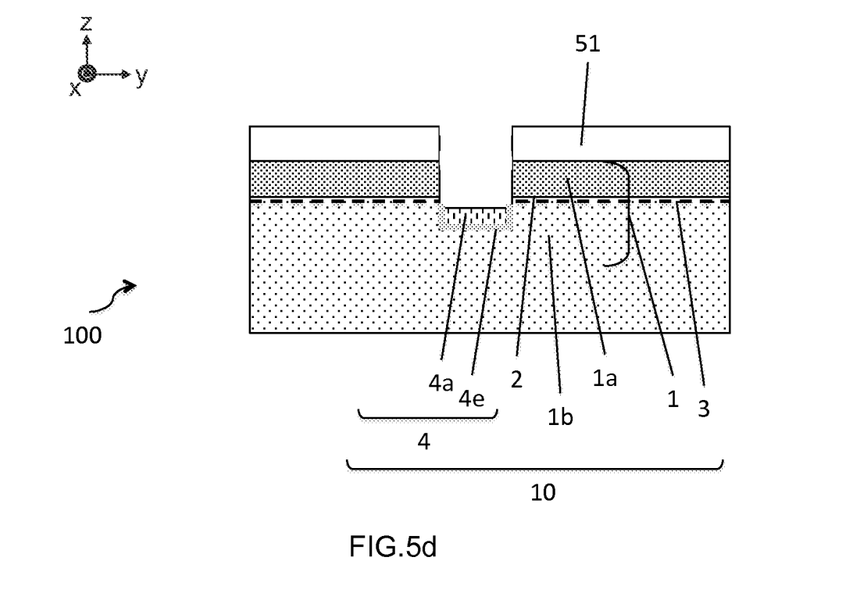

The layer 400a is then etched, by dry or wet etching, to leave only the desired layer thickness in the trench 5 and form the first semiconductor portion 4a (FIG. 5d). By way of example, the target thickness (along the z axis) of the first semiconductor portion 4a will be 35 nm, i.e., approximately 5 nm below the interface 2. The dielectric layer 4e is itself also etched and only remains locally, to insulate the first semiconductor portion 4a from the channel layer 1b of the stack 1 (FIG. 5d).

Figure 5E:
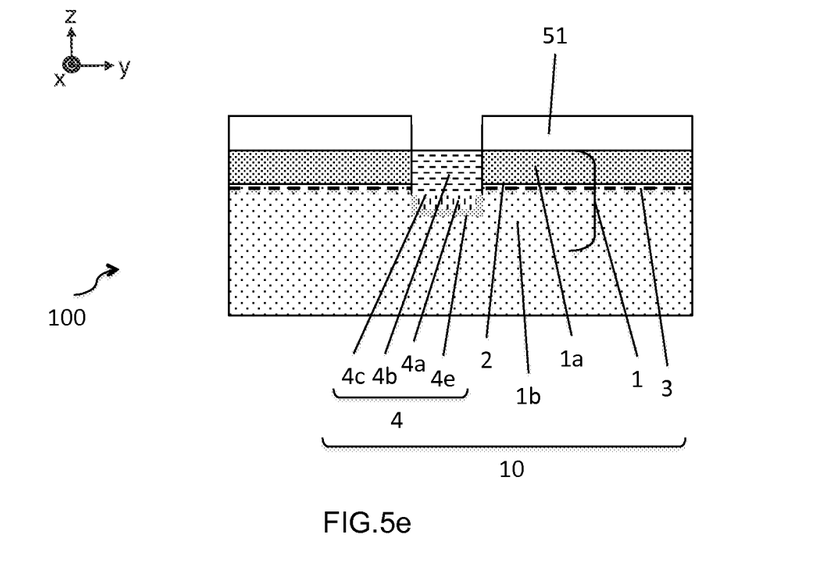

The second semiconductor portion 4b is produced in a similar manner, by depositing and then etching a layer (for example, N– doped GaN, according to the second embodiment) to the desired thickness (for example, FIG. 5e).

After removal of the protective layer 51, the insulating layer 50, the source 20, drain 30 and gate 40 electrodes can then be produced according to conventional methods.

With a first semiconductor portion 4a of the bar 4 doped P+ at a level around $1^E20/cm^3$, and a second semiconductor portion 4b doped N– at a level around $1^E15/cm^3$, a depletion thickness e of the space charge region 4d is awaited of the order of 70 nm in the N– type material of the bar 4; such a configuration leads to the total depletion of the second semiconductor portion 4b of the bar 4.

The space charge region 4d extends in the bar 4 at the plane of the conduction layer 3 of the stack 1, thus making it possible to cut off all conduction between the source electrode 20 and the drain electrode 30 and placing the transistor in the off state.

Applying a voltage to the gate electrode 40 will make it possible to eliminate the space charge region 4d and to re-establish the conduction through the bar 4, in the plane of the conduction layer 3, switching the transistor to the on state.

Naturally, the invention is not limited to the described embodiments, and it is possible to make variant embodiments without departing from the scope of the invention as defined by the claims.

The invention claimed is:

1. An enhancement-mode high-electron-mobility transistor, comprising:
   a structure having a first layer and a second layer of III-N-type semiconductor materials;
   a source electrode and a drain electrode, each in electrical contact with the structure;
   a gate electrode on the structure, between the source electrode and the drain electrode, the gate electrode having a first surface;
   a bar under the gate electrode along a first direction, the bar including:
      a n-type gallium nitride layer in the first layer, the n-type gallium nitride layer having a first face transverse to a second face;
      a p-type gallium nitride layer directly on the n-type gallium nitride layer along the first direction; and
      a PN junction at the interface of the n-type gallium nitride layer and the p-type gallium nitride layer;
   an insulating layer between the gate electrode and the bar, the insulating layer having a first surface opposite a second surface along the first direction, the first surface of the gate electrode being between the first surface of the insulating layer and the second surface of the insulating layer along the first direction; and
   a dielectric layer covering the first face and the second face of the n-type gallium nitride layer.

2. The enhancement-mode high-electron-mobility transistor of claim 1, wherein the n-type gallium nitride layer includes the interface between the first and second layer of the structure.

3. The enhancement-mode high-electron-mobility transistor of claim 2, wherein the first layer comprises a channel layer above a conduction layer, the bar being electrically insulated from the channel layer by the dielectric layer, the dielectric layer being thin enough not to block current at the conduction layer when the enhancement-mode high-electron-mobility transistor is in an on state.

4. The enhancement-mode high-electron-mobility transistor of claim 3, wherein the gate electrode and the insulating layer form a gate with a metal-insulator semiconductor configuration.

5. A device, comprising:
   a high-electron mobility transistor that includes:
      a semiconductor substrate that includes:
         a channel layer; and
         a conductive layer;
      a source electrode;
      a drain electrode;
      a trench in the substrate between the source electrode and the drain electrode;
      a barrier layer on the channel layer, between the source electrode and the drain electrode, the trench being through the barrier layer and into the substrate;
      a n-type gallium nitride layer in the trench in the channel layer, the n-type gallium nitride layer having a first face opposite a second face and a plurality of lateral faces transverse to the first and second faces;
      a p-type gallium nitride layer in the trench in direct contact with the first face of the n-type gallium nitride layer;
      a PN junction in the trench between the n-type gallium nitride layer and the p-type gallium nitride layer; and
      a dielectric layer in the trench, the dielectric layer covering the second face and the plurality of lateral faces of the n-type gallium nitride layer.

6. The device of claim 5,
wherein the dielectric layer is thin enough to enough not to block current at the channel layer when the high-electron mobility transistor is in an on state.

7. The device of claim 5, further comprising a gate electrode insulated from the substrate by an insulating layer to form a gate with a metal-insulator semiconductor configuration.

8. The device of claim 5, wherein the n-type gallium nitride layer consists of a first material of a first doping type and the p-type gallium nitride layer consists of the first material of a second doping type.

9. The device of claim 8, wherein the n-type gallium nitride layer further comprises:
a first doped layer of a first doping level; and
a second doped layer of a second doping level, the second doping level being less than the first doping level, and the second doped layer being between the first doped layer and the PN junction.

10. The device of claim 7, wherein the gate electrode has a first face opposite a second face along a first direction and the insulating layer has a first face opposite a second face along the first direction, the first face of the gate electrode being between the first face and the second face of the insulating layer.

11. The device of claim 10, wherein the second face of the insulating layer is a first distance from the first face of the insulating layer and the second face of the gate electrode is a second distance from the first face of the insulating layer, the second distance being greater than the first distance.

12. The device of claim 5, further comprising a space charge region extending from the PN junction into the n-type gallium nitride layer and the p-type gallium nitride layer.

13. A device, comprising:
a channel layer;
a barrier layer on the channel layer;
a first interface between the barrier layer and the channel layer;
a first electrode through the barrier layer and on the channel layer;
a second electrode through the barrier layer and on the channel layer;
a trench through the barrier layer and into the channel layer;
a PN junction in the trench between a first gallium nitride layer having a first dopant in the trench and a second gallium nitride layer in the trench on the first gallium nitride layer, the second gallium nitride layer having a second dopant that is different from the first dopant,
wherein the PN junction is aligned along a first direction with the first interface between the barrier layer and the channel layer;
a gate electrode coupled to the PN junction, aligned with the trench along a second direction transverse to the first direction, and between the first and second electrode along the first direction; and
a dielectric layer in the trench between the first gallium nitride layer and the channel layer.

14. The device of claim 13, further comprising a protection layer on the barrier layer, the gate electrode being recessed into the protection layer.

15. The device of claim 13, wherein the gate electrode is a metal-insulator semiconductor.

16. The device of claim 13, wherein the first gallium nitride layer consists of a first material of a first doping type and the second gallium nitride layer consists of the first material of a second doping type.

17. The device of claim 16, wherein the first gallium nitride layer further comprises:
a first doped layer of a first doping level; and
a second doped layer of a second doping level, the second doping level being less than the first doping level, and the second doped layer being between the first doped layer and the PN junction.

18. The device of claim 13, wherein the dielectric layer in the trench, covers a first surface of the first gallium nitride layer and a second surface of the first gallium nitride layer transverse to the first surface.

19. The device of claim 18, further comprising a two-dimensional electron gas layer below the first interface between the barrier layer and the channel layer.

20. The device of claim 19, wherein the dielectric layer separates the first gallium nitride layer and the second gallium nitride layer from the two-dimensional electron gas layer.

* * * * *